United States Patent
Shan

(10) Patent No.: US 7,290,407 B1
(45) Date of Patent: Nov. 6, 2007

(54) TRIANGLE-SHAPED PLANAR OPTICAL WAVEGUIDE HAVING REDUCED SCATTERING LOSS

(75) Inventor: Jesse Chienhua Shan, 1955 Laver Ct., Los Altos, CA (US) 94024

(73) Assignee: Jesse Chienhua Shan, Los Altos, CA (US)

(*) Notice: Subject to any disclaimer, the term of this patent is extended or adjusted under 35 U.S.C. 154(b) by 1156 days.

(21) Appl. No.: 10/025,002

(22) Filed: Dec. 19, 2001

(51) Int. Cl.
*C03B 37/018* (2006.01)
(52) U.S. Cl. .............................. 65/386; 65/390; 65/391
(58) Field of Classification Search ................. 65/386, 65/390, 391
See application file for complete search history.

(56) References Cited

U.S. PATENT DOCUMENTS

| | | | |
|---|---|---|---|
| 3,883,335 A * | 5/1975 | Polaert ........................ 65/386 |
| 4,375,312 A * | 3/1983 | Tangonan ................... 385/132 |
| 4,494,968 A * | 1/1985 | Bhagavatula et al. ......... 65/386 |
| 4,619,680 A * | 10/1986 | Nourshargh et al. .......... 65/386 |
| 4,856,859 A * | 8/1989 | Imoto ........................ 385/129 |
| 5,107,538 A | 4/1992 | Benton et al. |
| 5,119,460 A | 6/1992 | Bruce et al. |
| 5,141,549 A * | 8/1992 | Tumminelli ................. 65/386 |
| 5,178,658 A * | 1/1993 | Tumminelli et al. .......... 65/386 |
| 5,198,008 A * | 3/1993 | Thomas ....................... 65/386 |
| 5,206,925 A * | 4/1993 | Nakazawa et al. .......... 385/142 |
| 5,387,269 A * | 2/1995 | Nijander et al. .............. 65/386 |
| 5,494,854 A * | 2/1996 | Jain ........................... 438/692 |
| 5,693,116 A | 12/1997 | Kanamori et al. |
| 5,719,976 A | 2/1998 | Henry et al. |
| 5,858,051 A * | 1/1999 | Komiyama et al. ........... 65/386 |
| 5,900,057 A | 5/1999 | Buchal et al. |
| 5,938,811 A * | 8/1999 | Greene ....................... 65/385 |
| 6,154,582 A * | 11/2000 | Bazylenko et al. ........... 385/14 |
| 6,251,795 B1 * | 6/2001 | Shan et al. .................. 438/723 |
| 6,410,446 B1 * | 6/2002 | Tsai et al. .................... 438/695 |
| 6,411,765 B1 * | 6/2002 | Ono .......................... 385/131 |
| 6,584,807 B1 * | 7/2003 | Tregoat et al. ............... 65/386 |
| 6,606,442 B2 * | 8/2003 | Korenaga et al. ........... 385/129 |
| 6,705,124 B2 * | 3/2004 | Zhong et al. ................ 65/386 |

* cited by examiner

*Primary Examiner*—John Hoffmann

(57) ABSTRACT

A method for forming an optical waveguide is disclosed. The method comprises first forming a lower cladding layer having at least one waveguide support. Next, a core material is formed onto the waveguide support using a high density plasma chemical vapor deposition (HDPCVD) process. Finally, an upper cladding layer is formed over the core material, such that the upper cladding layer and the lower cladding layer surround the core material.

4 Claims, 3 Drawing Sheets

TRIANGLE-SHAPED PLANAR OPTICAL WAVEGUIDE HAVING REDUCED SCATTERING LOSS

FIELD OF THE INVENTION

The present invention relates to optical waveguides, and more particularly, to a planar optical waveguide formed using a high-density plasma chemical vapor deposition (HDPCVD) process.

BACKGROUND OF THE INVENTION

The use of optical waveguides formed by semiconductor manufacturing techniques has exploded in recent years. Both passive optical waveguides and active optical waveguides have found extensive application in communications and other fields. A passive optical waveguide is an optical waveguide that carries optical signals without providing amplification of the optical signal. In contrast, an active optical waveguide is an optical waveguide that provides some measure of amplification of the optical signal carried within the active optical waveguide.

Typically, a passive optical waveguide can be formed from a glass-like core material, such as silicon dioxide, surrounded by a cladding material. Similarly, an active optical waveguide has a core material that is surrounded by a cladding material. The core material is typically doped with a rare earth element, such as erbium. Thus, the core material is typically silicon dioxide doped with erbium.

In both passive and active optical waveguides, the intensity of the optical signal is attenuated by various effects, such as scattering loss associated with a surface roughness in the interface between the core material and the cladding. The attenuation caused by surface roughness is significant and is undesirable.

Prior art optical waveguides are exemplified by U.S. Pat. No. 5,900,057, U.S. Pat. No. 5,206,925, U.S. Pat. No. 5,693,116, and U.S. Pat. No. 5,119,460. In each of these prior art optical waveguides, the core material which carries the optical signal has substantially a rectangular cross sectional shape. The core material is of rectangular shape for apparently no other reason than the rectangular shape inherently results from the semiconductor processes used to manufacture the optical waveguide, such as deposition and etching.

Specifically, in one prior art process, the core material is deposited onto a lower cladding material and dry etched to form a "ridge" structure. Next, an upper cladding layer is deposited over the core material so as to surround the core material. In order to have an effective optical waveguide, the upper and lower cladding layers must have an index of refraction that is lower than the core material. This technique is exemplified by U.S. Pat. No. 5,119,460.

Alternatively, a damascene process may be used to form the prior art optical waveguides. Specifically, a lower cladding material may have trenches etched therein to carry the core material. The core material is deposited into the trenches and then, using chemical mechanical polishing, the core material outside of the trenches is removed. The upper cladding material is then deposited thereby surrounding the core material. In both of these techniques, because of the deposition and etching techniques used, the optical waveguide has a rectangular shaped core.

In each of these processes, an etching process, such as reactive ion etching (RIE), is used. The use of RIE on oxide typically produces sidewall roughness on the order of 20-50 um surface roughness. However, good optical performance requires 5 um (or better) surface roughness to avoid scattering loss during light propagation. Thus, the prior art methods produce a less than optimum optical waveguide.

DETAILED DESCRIPTION

The present invention discloses an optical waveguide that has a triangular or semicircular shape. Further, a method is disclosed for forming an optical waveguide using high-density plasma chemical vapor deposition (HDPCVD) process techniques.

In the following description, numerous specific details are provided to give a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figures 1, 2:
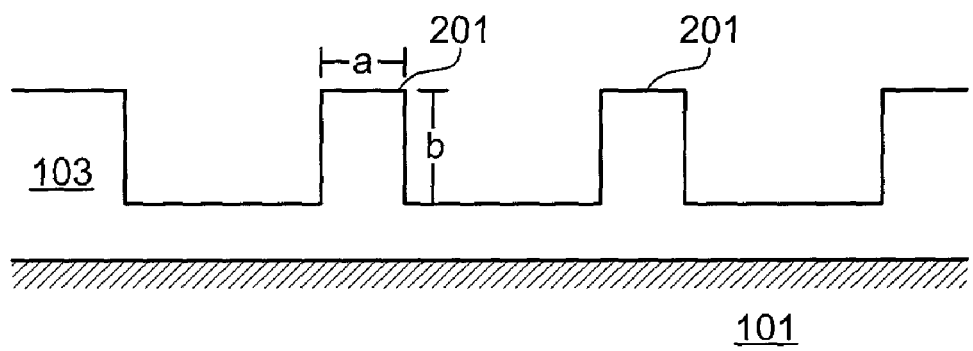
FIGS. 1-4 are cross-sectional views of a semiconductor substrate illustrating a method in accordance with the present invention for forming an optical waveguide.

Turning to FIG. 1, a substrate 101 is formed thereon a lower cladding layer 103. The substrate 101 may be, for example, formed from silicon, such as from a silicon wafer. Alternatively, numerous other materials can be used for the substrate 101, insofar as the substrate 101 serves primarily as support for the optical waveguide. Examples of suitable substrates on which the lower cladding layer 103 may be formed includes single crystalline quartz substrates, fused quartz substrates, aluminum oxide substrates, calcium fluoride substrates or silicon substrates.

The lower cladding layer 103 can also be formed from various materials, such as various types of silicon dioxide. As in the prior art, the importance of the lower cladding layer 103 is to surround and isolate the actual optical waveguide. Therefore, the lower cladding layer 103 should have an index of refraction which is lower than that of the core material forming the optical waveguide.

In one embodiment, the lower cladding layer 103 may be silicon. In such a situation, then the substrate 101 can also double as the lower cladding layer 103. Other material suitable for use as a lower cladding layer include thermal oxide, phosphorous doped silicon dioxide, borophosphosilicate glass (BPSG), germanium doped silicon dioxide, or silicon rich silicon dioxide.

Turning to FIG. 2, after the lower cladding layer 103 has been deposited, the lower cladding 103 is etched using conventional patterning and etching techniques to form waveguide supports 201. As will be seen in greater detail below, the width (A) and the height (B) of the waveguide supports 201 may be varied to control the shape of the actual optical waveguide. If the height (B) is much greater than the width (A) of the waveguide support 201, the resulting optical waveguide will have a substantially triangular shape. However, if the height (B) is comparable to or less than the width (A) of the waveguide support 201, then the resulting optical waveguide will be trapezoidal in shape. As detailed in my U.S. Pat. No. 6,251,795, the use of high density plasma chemical vapor deposition (HDPCVD) techniques to deposit the core material can be controlled to form a core of the desired shape.

In one actual embodiment, the width (A) is on the order of four to fifteen microns and the height (B) is on the order of ten to twenty-five microns. However, it can be appreciated that the width (A) of the waveguide support 201 can be varied depending upon the desired dimensions of the optical waveguide. Additionally, in FIG. 2, two waveguide supports 201 are shown adjacent to one another. Typically, the waveguide supports 201 are separated by relatively wide distances, on the order of 100-500 microns. However, it can be appreciated that the distances between waveguide supports 201, and therefore the actual optical waveguides, may vary immensely depending upon the required applications.

As noted above, in one embodiment, the height (B) of the waveguide support 201 is on the order of 10-25 microns. Therefore, the thickness of the lower cladding layer 103 should be at least that thick and preferably several microns thicker. The etching of the lower cladding layer 103 can be accomplished using conventional etching and patterning techniques well known in the semiconductor process field. For example, a dry reactive ion etch may be used after a masking layer has been deposited and patterned. Alternatively, a wet etch may also be used.

Figure 3:
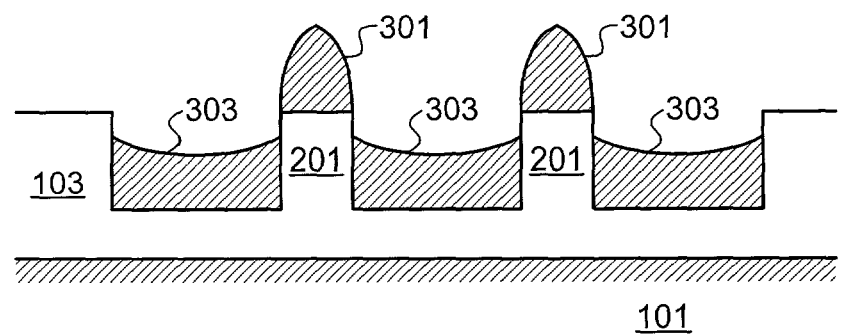

Next, turning to FIG. 3, a core material is deposited onto the etched lower cladding layer 103. In one embodiment, the core material is deposited using a HDPCVD method. One of the characteristics of depositing core material using an HDPCVD method is the formation of substantially triangular shaped portions on raised areas of the underlying lower cladding layer 103. Therefore, referring to FIG. 3, disposed onto the tops of the waveguide supports 201 are triangular waveguides 301. As detailed in my U.S. Pat. No. 6,251,795, the use of high density plasma chemical vapor deposition (HDPCVD) techniques to deposit the core material can be controlled to form a core of the desired shape. Thus, the triangular shape (whether concave or convex) of the waveguides can be controlled by the process parameters.

It should be noted that the HDPCVD process is most commonly used in forming interlayer dielectrics in semiconductor processing of integrated circuits. Thus, many semiconductor equipment makers supply equipment well suited for the HDPCVD processes.

Because the HDPCVD process is a blanket deposition process, deposited in the trenches between the waveguide supports 201 is waste core material 303. This waste core material 303 is not used in the optical waveguide and, as will be seen below, is isolated from the triangular waveguides 301. The core material deposited using the HDPCVD method can be one of many different types of core materials commonly used for conventional optical waveguides. The only limitation is that the core material should have an index of refraction that is higher than that of the lower cladding layer 103 and an upper cladding layer 401 (seen in FIG. 4). The precise difference in the index of refraction between the core material and the cladding layers 103 and 401 is selected to match with the desired light mode and optical properties (for example: gain, loss, or noise figure).

For example, the core material may be formed from a trivalent material formed using $LaF_3$, $YF_3$, or $LuF_3$. Sources and techniques for depositing core material specified herein are well known to those skilled in the art. Additionally, if an active optical waveguide is desired, a dopant such as erbium can be introduced while depositing the core material. For example, the dopant may be $ErF_3$.

The thickness of the core material to be deposited is a matter of design choice, but is typically of the same thickness as the width (A) of the waveguide supports 201.

In an alternative embodiment, the core material may be formed from phosphosilicate glass or silicon rich silicon dioxide for passive waveguides. The phosphorus content, and concomitantly the refractive index, of the glass is selected to provide desired waveguiding properties according to methods well known in the art. The useful range of glass compositions for the core material consists of silica containing up to about 8% weight phosphorous and the phosphorous content more typically lies in the range of 4-8% by weight. As noted above, the core material may be doped with erbium to provide an active optical waveguide.

Figure 4:
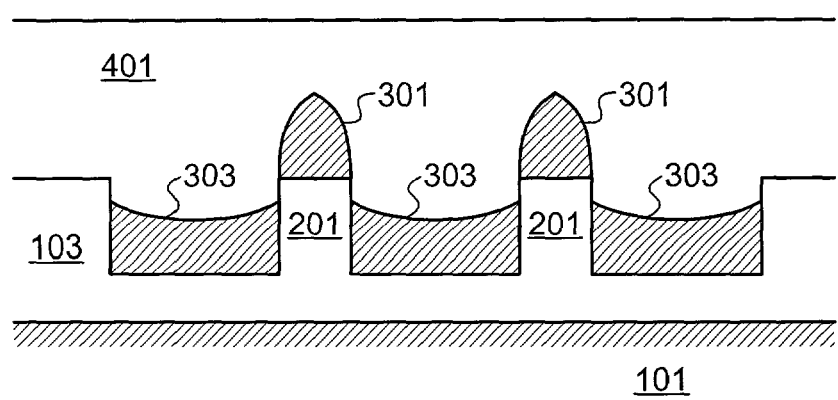
Figure 6:
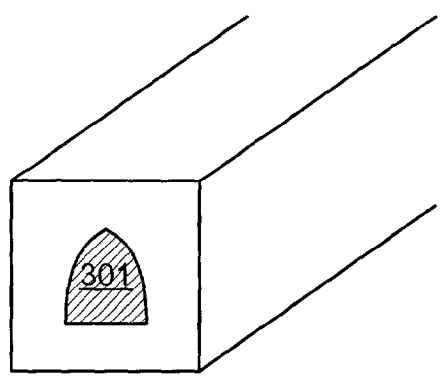
FIG. 6 is an isometric view of an optical waveguide formed in accordance with the present invention.

After the core material has been deposited, turning to FIG. 4, an upper cladding layer 401 is deposited over the core material and the lower cladding layer 103. The upper cladding layer, in one embodiment, may be of the same material as the lower cladding layer 103. Alternatively, the upper cladding layer may be of a different material than the lower cladding layer. However, it is important that the upper cladding layer 401 have an index refraction which is less than the triangular waveguide 301. As seen in FIG. 4, the waste core material 303 that is formed in the trenches between the optical waveguide 301 is isolated from the triangular waveguides 301 by the lower cladding material. The resulting triangular waveguide 301 is shown in FIG. 4 and in FIG. 6 (in isometric view).

Figure 5:
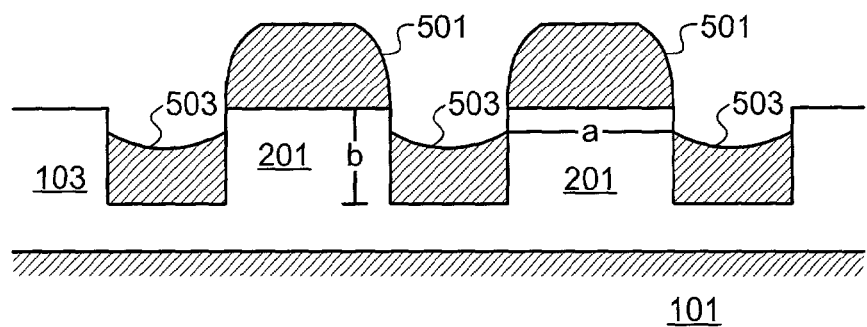
FIG. 5 is a cross-sectional view of a semiconductor substrate illustrating an optical waveguide formed in accordance with an alternative embodiment of the present invention.

Turning to FIG. 5, an alternative embodiment is illustrated which has a width (A) of the waveguide support 201 comparable in dimension to the height (B) of the waveguide support 201. The result is that when the core material is deposited, an optical waveguide 501 has a trapezoidal shape. This embodiment results in an optical waveguide 501 that is advantageous because it is substantially a semi-circular shape which provides lower coupling loss.

The optical waveguides 301 and 501 formed in accordance with the present invention have several significant advantages over the prior art. For example, as seen above, the dimensions of the optical waveguide can be controlled by controlling the width (A) of the waveguide support 201 and by controlling the amount of core material deposited using the HDPCVD process.

The rectangular or square waveguides of the prior art included significant scattering loss due to surface roughness on the edges of the optical waveguide. By forming a triangular shaped waveguide, the scattering loss can be reduced by up to 25% simply due to surface area reduction. Assuming that the oxide etching was performed by the same RIE process, meaning that the waveguide surface roughness after the RIE is the same, then the triangular waveguide has about 25% less surface area then a square shaped waveguide, which will reduce the scattering loss significantly.

Specifically, $$\text{Total loss} = \text{coupling loss} + \text{propagation loss}$$
$$= a + kxf(L)$$

The propagation loss is a function of the waveguide length (f(L)), so it has a higher effect on the total loss. The parameter k is the loss per unit area that came from surface roughness.

Third, the prior art required that the core material be deposited and then etched (for a ridge structure) or deposited and polished (for a damascene structure). In the present invention, once the core material has been deposited, there is no need for etching. Indeed, etching of the active core material could be very critical and difficult with RIE. This is because there may be erbium or aluminum dopants, which are difficult materials to etch. Further, the material is coarse resulting in a rough etched surface. Without the need for etching, throughput is increased, which lowers the cost of manufacturing of the optical waveguide. Additionally, because there is no need for etching of the core material, the upper cladding layer 401 may be deposited in situ with the deposition of the HDPCVD core material. This also serves to significantly reduce cost and increase yield of the optical waveguides.

Finally, the triangular or semi-circular shape of the triangular waveguide 301 fits the light load of optical signals (a Gaussian shape) better than a square shape. This helps to capture the maximum amount of optical signal during fiber coupling.

While specific embodiments of, and examples for, the invention are described herein for illustrative purpose, various equivalent modifications are possible within the scope of the invention, as those skilled in the art will recognize. These modifications can be made to the invention in radiation of the detailed description. The terms used in the following claims should not be construed to limit the invention to specific embodiments disclosed in the specification and the claims. Rather, the scope of the invention is to be determined entirely by the following claims, which are to be construed in accordance with established doctrines of claim interpretation.

What is claimed is:

1. A method comprising:
    forming a lower cladding layer, said lower cladding layer having at least one waveguide support, said at least one waveguide support being raised relative to said lower cladding layer such that said at least one waveguide support has a waveguide support width dimension and a waveguide support height dimension, said waveguide support width dimension less than said waveguide support height dimension;
    forming a core material onto said at least one waveguide support using a high density plasma chemical vapor deposition (HDPCVD) process, wherein said core material is an oxide; and
    forming an upper cladding layer over said core material, wherein said upper cladding layer and said lower cladding layer surround said core material.

2. The method of claim 1 wherein the step of forming said lower cladding layer comprises:
    blanket depositing lower cladding material onto a substrate; and
    patterning and etching said lower cladding material to form said waveguide support.

3. The method of claim 1 wherein the step of forming said core material is performed such that said core material is doped with a rare earth element.

4. The method of claim 1 wherein the steps of forming said core material and forming said upper cladding layer are in situ with each other.

* * * * *